United States Patent
Drakshapalli et al.

(10) Patent No.: US 7,477,178 B1
(45) Date of Patent: Jan. 13, 2009

(54) POWER-OPTIMIZED ANALOG-TO-DIGITAL CONVERTER (ADC) INPUT CIRCUIT

(75) Inventors: Prashanth Drakshapalli, Austin, TX (US); Larry L. Harris, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/772,132

(22) Filed: Jun. 30, 2007

(51) Int. Cl.
*H03M 1/36* (2006.01)

(52) U.S. Cl. .................... 341/159; 341/155

(58) Field of Classification Search .......... 341/155–170
See application file for complete search history.

(56) References Cited

U.S. PATENT DOCUMENTS

| | | | |
|---|---|---|---|
| 6,055,418 A * | 4/2000 | Harris et al. | 455/91 |
| 6,252,454 B1 * | 6/2001 | Thompson et al. | 330/9 |
| 6,798,881 B2 * | 9/2004 | Thomasson | 379/406.07 |
| 6,810,216 B1 | 10/2004 | Tourunen et al. | |
| 6,888,482 B1 * | 5/2005 | Hertle | 341/159 |
| 2004/0051555 A1 | 3/2004 | Wilcox et al. | |
| 2004/0128416 A1 * | 7/2004 | Kurts et al. | 710/107 |
| 2004/0257114 A1 | 12/2004 | Hannenberg et al. | |
| 2006/0172715 A1 | 8/2006 | Carballo et al. | |

OTHER PUBLICATIONS

U.S. Appl. No. 11/534,191, filed Sep. 21, 2006, Nanda, et al.

* cited by examiner

*Primary Examiner*—Lam T Mai
(74) *Attorney, Agent, or Firm*—Andrew M. Harris; Mitch Harris, Atty at Law, LLC

(57) ABSTRACT

A power-optimized analog-to-digital converter (ADC) input circuit provides for optimized power consumption versus performance. The first amplifier stage of the ADC is provided by a plurality of amplifiers that are selectably enabled to provide a particular bandwidth and noise performance level. The selection of the combination of enabled amplifiers may be made in conformity with the sample rate of the converter and the amplifiers may have evenly-weighted bias currents, or unevenly weighed bias currents and may be optimized for their particular use in combinations for bandwidth and 1/f noise corner performance. The outputs of the amplifiers are combined in a combiner circuit, which may be a discrete-time chopping amplifier that receives charges from a plurality of capacitors that sample each enabled amplifier output.

29 Claims, 3 Drawing Sheets

POWER-OPTIMIZED ANALOG-TO-DIGITAL CONVERTER (ADC) INPUT CIRCUIT

BACKGROUND OF THE INVENTION

1. Field of the Invention

The present invention relates generally to analog-to-digital (ADC) converter input circuits, and more specifically, to an ADC input circuit with optimized power consumption versus sample rate.

2. Background of the Invention

The input circuit of a low-noise analog-to-digital converter (ADC) may consume a significant amount of the total power used by the ADC, particularly at low sample rates. The noise level at the first amplifier stage, which may be a preamplifier (buffer) or the first stage of the loop filter of a delta-sigma modulator-based ADC, typically dominates the signal-to-noise ratio (SNR). Therefore, the bias current of the first amplifier stage must be high enough so that thermal noise will not degrade the SNR. Furthermore, the bias current also must be high enough to ensure that distortion levels, e.g., the total harmonic distortion (THD), are within the required performance range. The distortion levels are dependent on both the linearity of the amplifiers, and their slew rate.

In sample rate converters supporting a wide range of sampling rates, the slew rate requirements vary. At high sampling rates, the settling time must necessarily be decreased, requiring a wider bandwidth, and consequently more power provided to the amplifier stages. Generally, the settling time and SNR demand a highest power level from the first amplifier/integrator of the loop filter, as to maximize the SNR, the gain of the first integrator stage is typically set to a high value. At lower sampling rates, the settling time can be longer, and circuits have been proposed to adjust the power level of the first integrator stage by adjusting the bias current level to save power when the settling time requirements are lower. However, power consumption of an amplifier is generally not linear with settling time, and reduction of the bias current typically leads to an increase in non-linearity. Furthermore, operation of an amplifier over a wide range of bias current leads to a wide variation in operating point, which makes design of the circuits incorporating the amplifier very complex.

In sample rate converters having a programmable gain discrete-time integrator in the first, settling time and slew rate requirements also vary, as the gain is changed by changing the input sampling capacitor, and at the maximum gain/maximum sampling capacitance value will require larger output current levels to produce the required settling time.

Therefore, it would be desirable to provide an input circuit for an ADC that uses power efficiently over a wide range of bandwidth, gain, and noise requirements for the first amplifier stage.

SUMMARY OF THE INVENTION

The above stated objective of providing an input circuit for an ADC that uses power efficiently over a wide range of bandwidth and noise requirements is accomplished in a circuit and method. The method is a method of operation of the circuit.

The circuit includes a plurality of amplifiers at least some of which can be selectively disabled, and an output circuit for combining the outputs of the plurality of amplifiers to provide the output of the first amplifier stage of the ADC. The amplifiers each receive a common input signal or pair of differential input signals, and the circuit provides selectable power consumption, gain/bandwidth, and noise floor by selectively enabling combinations of the amplifiers. The selection may be made in conformity with a selected sample rate of the converter, so that the bandwidth of the resultant first amplifier stage is changed to provide the necessary performance for the selected sample rate.

The output circuit may be a chopper-stabilized amplifier that receives inputs from the plurality of amplifier stages. The amplifier bias currents may be evenly weighted, but alternatively may be non-evenly weighted and particularly optimized for 1/f noise corner and/or bandwidth with respect to their enabled states in combination with other amplifiers or alone.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses input circuits for analog-to-digital (ADC) converter circuits, in which power consumption can be optimized by selecting a combination of input amplifier slices to yield a selectable power consumption for the combined input amplifier. The bandwidth and/or 1/f noise corner can be tailored to a particular application and sample rate, and can be selected automatically in response to a selection of the sample rate of the converter. The use of amplifier slices, rather than adjusting the bias current of a single amplifier, preserves the DC operating point of the overall amplifier stage, resulting in simplified design and improved performance of the ADC converter. The programmable performance level of the overall amplifier further permits selection of the slew rate of the amplifier to drive selectable capacitive loads, such as when the input sampling capacitance or feedback capacitance of an integrator is changed to program the gain of the integrator.

Figure 1:
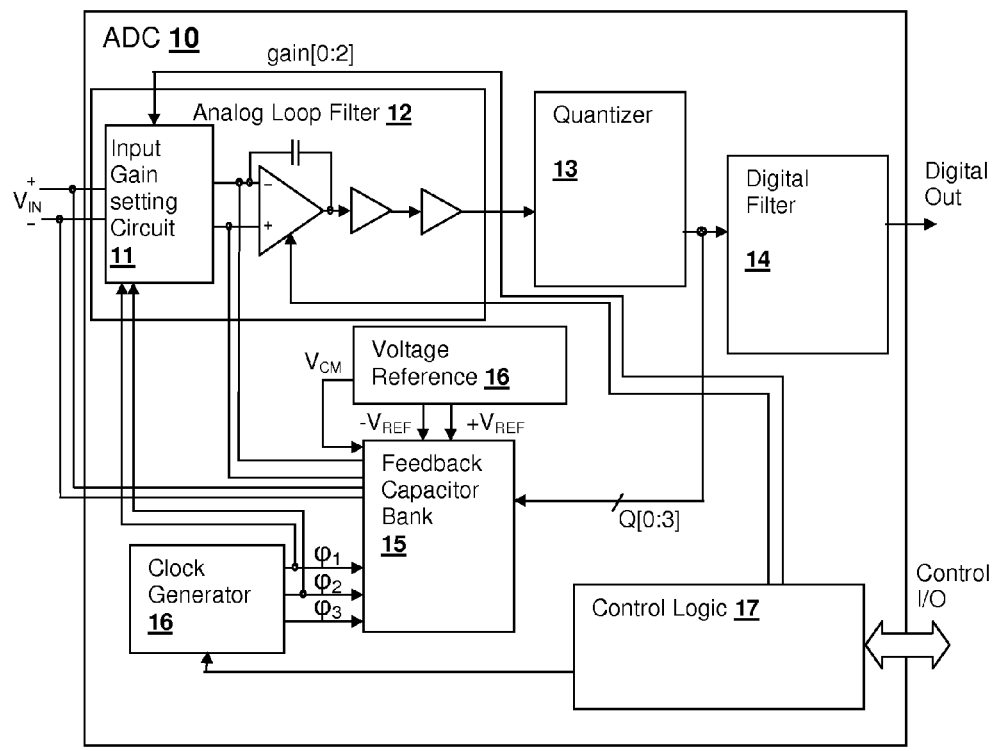
FIG. 1 is a block diagram depicting an ADC integrated circuit 10 in accordance with an embodiment of the present invention.

Referring now to FIG. 1, an ADC integrated circuit 10, in accordance with an embodiment of the present invention, is shown. An analog loop filter 12 receives a differential input voltage signal $V_{IN}$ and provides a noise-shaped output signal to the input of a quantizer 13 that provides digital sample values to a digital filter 14, which in turn provides an ADC conversion digital output value Digital Out. The output Q[0:3] of quantizer 13 is also provided to a feedback capacitor bank 15, in which capacitors are selected to couple them each to one of a positive and negative voltage reference ($+V_{REF}$, $-V_{REF}$) signal provided from a voltage reference circuit 16. A common mode voltage signal $V_{CM}=(+V_{REF}-V_{REF})/2)$ is also provided from voltage reference circuit 16, and corresponds to the common-mode value of the reference feedback voltage selected by the quantizer output.

As mentioned above, feedback capacitor bank 15 is used to sample differential input voltage signal $V_{IN}$, simultaneously with applying the feedback charge selected by quantizer outputs Q[0:3] in the previous clock phase. An input gain-setting circuit 11, also samples the input voltage signal $V_{IN}$, except at a lowest gain setting, which uses only feedback capacitor bank 15 to sample differential input voltage signal $V_{IN}$. Gain-setting circuit 11 receives gain control select signals from a control logic circuit 17, which can receive gain setting values from externally-provided control input/output interface signals Control I/O. Control logic 17 is also coupled to amplifier A1 of the first integrator stage of analog loop filter 12, to set a power consumption level of amplifier A1 according to required settling time, open loop gain, slew rate, linearity, flicker noise corner and/or other requirements for the input stage of analog loop filter 12, in accordance with an embodiment of the invention. As mentioned above, the programmable power consumption level of amplifier A1 may be set in concert with the gain control select signals that set the gain of gain-setting circuit 11, so that as a sampling capacitance is increased to increase the gain of the first integrator stage of analog loop filter 12, the current drive capabilities of amplifier A1, for a given slew rate, are also increased.

Outputs of input gain-setting circuit 11 are coupled to the first integrator stage in analog loop filter 12, as are output terminals provided from feedback capacitor bank 15. A clock generator 16 controls switching circuits within feedback capacitor bank 15 and input gain setting circuit 11 to control sampling of input signal $V_{IN}$ and application of quantizer-dependent feedback reference voltages to the first integrator stage of analog loop filter 12, as will be described in more detail below with reference to FIG. 2. Clock generator 16 provides three successive and non-overlapping clock phases: phases $\phi_1$, $\phi_2$ and $\phi_3$. Clock generator 16 has a programmable clock rate for setting a word rate and thereby the corresponding sampling rate of quantizer 13.

Figure 2:
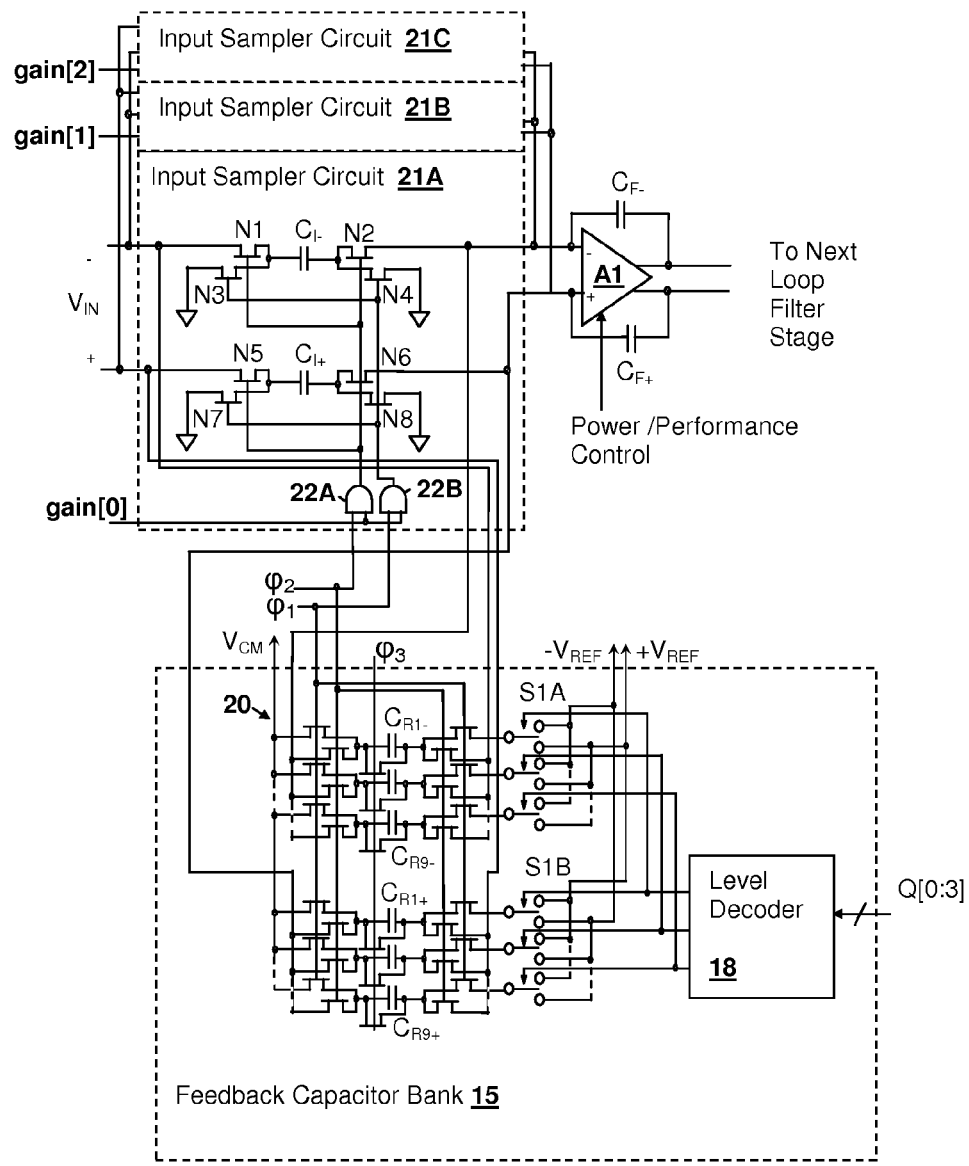
FIG. 2 is a schematic diagram depicting details of input sampler circuit 11 of FIG. 1 and feedback capacitor bank 15 of ADC integrated circuit 10 of FIG. 1.

Referring now to FIG. 2, details of input gain-setting circuit 11 and feedback capacitor bank 15 are shown. Input gain-setting circuit 11 is a differential circuit formed from multiple input sampler circuits 21A-21C, each having substantially identical design, except that in the exemplary embodiment, the sampling capacitors are weighted by powers-of-two to provide programmable gain according to a binary value gain[0:2]. Alternatively, input sampler circuits 21A-21C may be weighted to provide other desired gain combinations, such as logarithmic steps, uniform steps, or steps particularly selected to optimize the gain of the ADC input circuit of FIG. 2 in combination with the power consumption/performance settings of amplifier A1. As illustrated, the exemplary input sampler circuit 21A has two sampling capacitors $C_{I+}$, $C_{I-}$ and a pair of switching circuits formed by transistors N1-N8, which have gates controlled by clock phases $\phi_1$ and $\phi_2$, which are enabled according to the gain control input bit gain [0]. When clock phase $\phi_1$ is active, transistors N3,N4 and N7,N8 are activated, shorting both ends of sampling capacitors $C_{I+}$ and $C_{I-}$ to ground. When clock phase $\phi_2$ is active, transistors N1,N2 and N5,N6 are activated, coupling sampling capacitors $C_{I+}$ and $C_{I-}$ between the input terminals $V_{IN}$ and the corresponding summing nodes of a programmable-gain integrator formed by amplifier A1 and feedback capacitors $C_{F+}$, $C_{F-}$. Amplifier A1 receives a power/performance control setting from control logic 17 as described above.

Feedback capacitor bank 15 also includes a switching circuit 20 that is responsive to clock phases $\phi_1$, $\phi_2$ and $\phi_3$, so that when clock phase $\phi_1$ is active, reference capacitors $C_{R1-}$-$C_{R9-}$ and $C_{R1+}$-$C_{R9+}$ are coupled between reference common mode voltage $V_{CM}$ and a corresponding one of switch banks S1A or S1B. Switch banks S1A and S1B are controlled by the output of a level decoder 18 that receives quantizer output signals Q[0:3] and select which of reference voltages $V_{REF+}$ or $V_{REF-}$ to apply to each of capacitors $C_{R1-}$-$C_{R9-}$ and $C_{R1+}$-$C_{R9+}$ for the particular quantizer output level. The positions of reference voltages $V_{REF+}$ or $V_{REF-}$ are reversed for S1B with respect to switch bank S1A, so that a complementary set of capacitors is selected from capacitors $C_{R1+}$-$C_{R9+}$ for application of reference voltages $V_{REF+}$ or $V_{REF-}$. Therefore, a differential charge is provided between the sum of charges on capacitors $C_{R1-}$-$C_{R9-}$ and the sum of charges on capacitors $C_{R1+}$-$C_{R9+}$ at the end of clock phase $\phi_1$.

During clock phase $\phi_2$, switching circuit 20 couples all of capacitors $C_{R1-}$-$C_{R9-}$ to the input of the integrator implemented by amplifier A1 in parallel with any of capacitors $C_{I-}$ in input sampler circuits 21A-21C that are enabled by the corresponding gain[n] signal. The net charge corresponding to the feedback reference voltage applied to capacitors $C_{R1-}$-$C_{R9-}$ will be shared among the total parallel combination of capacitors $C_{R1-}$-$C_{R9-}$ and any of capacitors $C_{I-}$ in input sampler circuits 21A-21C that are enabled by the corresponding gain[n] signal. The increased sampling capacitance due to enabled input sampler circuits 21A-21C will increase the charge injected into integrator feedback capacitor $C_{F1+}$ due to input voltage $V_{IN-}$, but not the charge due to the feedback reference voltage. The result is that as the input gain is increased, the feedback reference voltage is automatically scaled down to match the same input voltage range.

The charge injected into integrator feedback capacitor $C_{F-}$ is determined only by the difference between the feedback reference voltages provided by the voltage on the parallel combination of capacitors $C_{R1-}$-$C_{R9-}$, as scaled by any charge sharing with capacitors $C_{I-}$ in input sampler circuits 21A-21C that are enabled, and input voltage $V_{IN-}$. The voltage difference, for frequencies substantially below the sampling rate, is only the quantization error and input noise. The operation and switching of capacitors $C_{R1+}$-$C_{R9+}$, capacitors $C_{I+}$ and feedback capacitor $C_{F+}$ are the same as for capacitors $C_{R1-}$-$C_{R9-}$, capacitors $C_{I-}$ and feedback capacitor $C_{F-}$ as described above, but in opposing polarity. The "flying" parasitic capacitance (coupling capacitance) between the circuit nodes that connect terminals of capacitors $C_{I+}$ and $C_{I-}$ to transistors N2, N4, N6 and N8 should be minimized as well as between capacitors $C_{R1-}$-$C_{R9-}$ and capacitors $C_{R1+}$-$C_{R9+}$ in circuit paths connected to switching circuit 20.

The relative capacitance of capacitors $C_{I+}$ and $C_{I-}$ are set in the exemplary embodiment to a value of G-1 times the capacitance of the total of capacitors $C_{R1-}$-$C_{R9-}$ (or $C_{R1+}$-$C_{R9+}$) where G is a scaling factor corresponding to the gain of the integrator formed around amplifier A1 with respect to input signal $V_{IN}$, relative to the feedback reference gain. Therefore, the total capacitance between each of the input terminals and the corresponding summing node of amplifier A1 is G times the capacitance of the reference bank capacitance.

Because the total number of capacitors $C_{R1+}$-$C_{R9+}$ and $C_{R1-}$-$C_{R9-}$ connected to each of reference voltage output $V_{REF+}$, $V_{REF-}$ of voltage reference 16 are equal, the effective DC voltage on the outputs of switches S1A and S1B is $V_{CM}$, no common-mode charge is pulled from voltage reference 16. During clock phase $\phi_3$ transistors in switching circuit short each of capacitors $C_{R1+}$-$C_{R9+}$ and $C_{R1-}$-$C_{R9-}$ to remove the voltage on capacitors $C_{R1+}$-$C_{R9+}$ and $C_{R1-}$-$C_{R9-}$, which is equal to input voltage $V_{IN+}$ for capacitors $C_{R1+}$-$C_{R9+}$ and input voltage $V_{IN-}$ for capacitors $C_{R1-}$-$C_{R9-}$, assuming the summing node inputs of amplifier A1 are at ground.

While the above-described feedback and clocking scheme provides the advantages of a high input impedance and for the use of a larger sampling capacitance for a given minimum input impedance requirement, it is understood that the amplifier techniques of the present invention, which are described in further detail below, may be applied to other forms of feedback, such as resistive ladder digital-to-analog converters used for quantizer feedback, and furthermore, to circuits having a conventional two-phase sampling input circuit.

Figure 3:
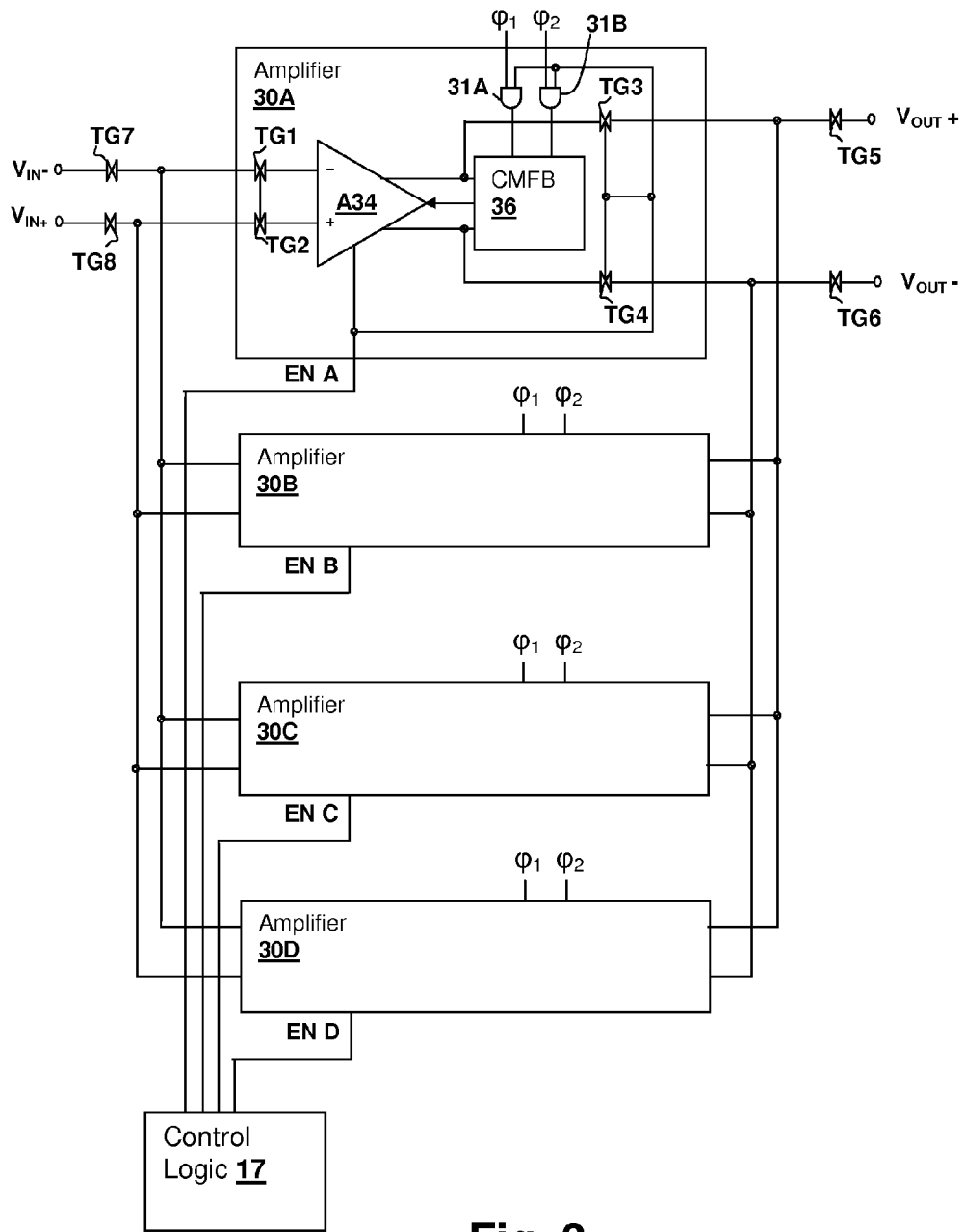
FIG. 3 is a schematic diagram depicting details of input amplifier A1 of ADC integrated circuit 10 of FIG. 1.

Referring now to FIG. 3, details of amplifier A1 are shown in accordance with an embodiment of the present invention. Amplifier A1 is formed from multiple "slices", which are separate amplifier circuits 30A-30D, each receiving the input signal, which is chopped by an input chopper circuit formed by transmission gates TG7 and TG8. Amplifier circuits 30A-30D are each enabled or disabled by a corresponding enable signal EN A-EN D provided from control logic 17. While the illustrative embodiment provides that amplifier circuits 30A-30D are substantially identical in design, except for transistor sizes and other parameters determined to optimize each of amplifier circuits 30A-30D for their particular power level and performance requirements, the invention is not limited to a set of amplifiers of identical topology. In some applications, it may be advantageous to select alternative topologies for lower-power-level amplifiers versus higher-power-level amplifiers. Furthermore, while in the illustrative embodiment amplifier circuits 30A-30D are assumed to have a power level dictated by performance requirements of a number of sample rates of ADC integrated circuit 10, in alternative embodiments, amplifier circuits 30A-30D may be identical and have identical power consumption. Alternatively, amplifier circuits 30A-30D may have power supply or bias currents weighted according to powers-of-two or another scheme to provide a programmable power consumption level. For programmable sample rate performance, one scheme provides amplifier circuits 30A-30D with slew rate contribution according to powers-of-two, so that the slew rate tracks a binary value that selects the sample rate.

As illustrated, amplifier circuits 30A includes input transmission gates TG1 and TG2 and output transmission gates TG3 and TG4, to isolate an amplifier A34 from the amplifier array when amplifier circuit 30A is disabled according to de-assertion of enable circuit EN A. Also, common-mode feedback (CMFB) circuit 36, which ordinarily receives clock phases $\phi_1$ and $\phi_2$, is disabled by logical AND-gates 31A and 31B, which stop the clocks provided to CMFB circuit 36, which are switched-capacitor CMFB circuits 36.

As mentioned above, amplifiers A34 in each of amplifier circuits 30A-30D, may be performance-optimized to provide particular performance levels, depending on how each of amplifier circuits 30A-30D contributes to the output signals $V_{OUT}+$ and $V_{OUT}-$. For example, assuming that amplifier circuit 30A is designed to consume the least power of all of amplifier circuits 30A-30D, and is generally selected at the lowest sample rate as the only amplifier enabled. Under such an exemplary assumption, the slew rate of amplifier 34 within amplifier circuit 30A is less critical than the flicker (1/f) noise corner, since at the lowest sampling rate, the required noise corner of amplifier A1 will be at its lowest frequency, but the longest settling time will be tolerated. Therefore, amplifier 34 in amplifier circuit 30A will generally be optimized for noise performance and low power consumption. Assuming, for example, that amplifier circuit 30D has the highest allocated power consumption level from among amplifier circuits 30A-30D and that all of amplifier circuits 30A-30D are enabled at the highest sampling rate of ADC integrated circuit 10. Under such exemplary assumptions, amplifier 34 in amplifier circuit 30D will generally be optimized for slew rate performance, in order to achieve the desired settling time, as the required noise corner is raised at the higher sampling rate. The overall slew rate and total flicker noise will be determined from the sum of the outputs of all of amplifier circuits 30A-30D, which improves the slew rate due to the sharing of output current requirements. The noise corner requirement for the totality of the amplifiers is determined according to the individual gain-noise products of each of amplifier circuits 30A-30D.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. An input amplifier circuit for an analog-to-digital converter integrated circuit, comprising:
    an input terminal for receiving an analog input voltage;
    a plurality of amplifiers for amplifying the analog input voltage, each having an input coupled to the input terminal, wherein at least some of the plurality of amplifiers have an enable input that substantially reduces a power supply current consumed by the amplifiers when in a disabled state;
    an output circuit for combining the outputs of the plurality of amplifiers; and
    a control logic coupled to the enable inputs of the at least some of the plurality of amplifiers for enabling selectable combinations from among the plurality of amplifiers, whereby particular performance levels and particular levels of power consumption of the input amplifier circuit are selected.

2. The input amplifier circuit of claim 1, wherein the output circuit is a chopper-stabilized amplifier circuit.

3. The input amplifier circuit of claim 1, wherein the plurality of amplifiers are substantially identical.

4. The input amplifier circuit of claim 1, wherein the plurality of amplifiers have bias currents that are weighted according to differing weight values.

5. The input amplifier circuit of claim 1, wherein the plurality of amplifiers have power consumption levels currents that are weighted according to differing weight values.

6. The input amplifier circuit of claim 1, wherein the plurality of amplifiers have slew rates that are weighted according to differing weight values.

7. The input amplifier circuit of claim 1, wherein the control logic is responsive to a sample rate selection of the analog-to-digital converter integrated circuit, whereby the selectable combinations from among the plurality of amplifiers are selected according to selectable sample rates of the analog-to-digital converter integrated circuit.

8. The input amplifier circuit of claim 7, wherein flicker noise corners of the selectable combinations of amplifiers are optimized for particular sample rates, whereby a first flicker noise corner of a first selected combination of amplifiers for a higher sample rate is higher than a second flicker noise corner of a second selected combination of amplifiers for a lower sample rate.

9. The input amplifier circuit of claim 7, wherein a particular one of the plurality of amplifiers selected individually for a lowest sample rate is optimized for noise performance while meeting a predetermined settling time requirement of the lowest sample rate.

10. The input amplifier circuit of claim 1, wherein a particular one of the plurality of amplifiers selected individually for a lowest power consumption level is optimized for noise performance while meeting a predetermined settling time requirement of the lowest sample rate.

11. The input amplifier circuit of claim 1, wherein each of the plurality of amplifiers comprises an input isolation circuit responsive to the enable input for disabling loading of the input terminal by the inputs of disabled ones of the plurality of amplifiers.

12. The input amplifier circuit of claim 1, wherein each of the plurality of amplifiers comprises an output isolation circuit responsive to the enable input for disabling loading of the output circuit by the outputs of disabled ones of the plurality of amplifiers.

13. The input amplifier circuit of claim 1, wherein each of the plurality of amplifiers comprises:
   a discrete-time common-mode feedback circuit; and
   a clock enable circuit responsive to the enable input, wherein clock phases supplied to the discrete-time common-mode feedback circuit are disabled for disabled ones of the plurality of amplifiers.

14. A method of amplifying an input signal provided to an analog-to-digital converter integrated circuit, the method comprising:
   selecting a combination of amplifiers from among a plurality of amplifiers, wherein unselected ones of the combination of amplifiers are disabled to reduce power consumption;
   receiving an analog input voltage input voltage;
   amplifying the input voltage or a signal derived from the input voltage with the plurality of amplifiers; and
   combining results of the amplifying from each of the amplifiers to yield an amplified output signal.

15. The method of claim 14, further comprising chopping the input voltage at a chopping frequency, whereby the combining combines a chopped signal.

16. The method of claim 14, wherein the selecting is performed from among the plurality of amplifiers and wherein the plurality of amplifiers are substantially identical.

17. The method of claim 14, wherein the selecting is performed from among the plurality of amplifiers and wherein the plurality of amplifiers have bias currents that are weighted according to differing weight values.

18. The method of claim 14, wherein the selecting is performed from among the plurality of amplifiers and wherein the plurality of amplifiers have power consumption levels currents that are weighted according to differing weight values.

19. The method of claim 14, wherein the selecting is performed from among the plurality of amplifiers and wherein the plurality of amplifiers have slew rates that are weighted according to differing weight values.

20. The method of claim 14, further comprising receiving a sample rate selection value, and wherein the selecting is performed in conformity with the sample rate selection value.

21. The method of claim 14, further comprising isolating outputs of unselected ones of the plurality of amplifiers, whereby outputs of said unselected ones of the plurality of amplifiers are not combined by the combining.

22. The method of claim 14, further comprising isolating inputs of unselected ones of the plurality of amplifiers, whereby the input voltage is not received by the unselected ones of the plurality of amplifiers.

23. The method of claim 14, further comprising disabling clocks to common-mode feedback circuits of disabled ones of the plurality of amplifiers.

24. An analog-to-digital converter circuit, comprising:
   a loop filter, having an input terminal for receiving an analog input voltage, wherein the first stage of the loop filter comprises an input amplifier circuit having a programmable power consumption level, wherein the input amplifier circuit includes a plurality of amplifiers for amplifying the analog input voltage, each having an input coupled to an input of the loop filter, wherein at least some of the plurality of amplifiers have an enable input that substantially reduces the power supply current consumed by the at least some amplifiers when in a disabled state, and an output circuit for combining the outputs of the plurality of amplifiers to provide an input to a next stage of the loop filter;
   a quantizer having an input coupled to an output of the loop filter for providing a noise-shaped digital representation of the input voltage;
   a digital filter coupled to an output of the quantizer for filtering the noise-shaped digital representation of the input voltage to provide a digital output value;
   a feedback reference voltage source having an input coupled to the output of the quantizer for providing a feedback signal to the loop filter having a reference voltage value dependent on the noise-shaped digital representation of the input signal; and
   a control logic coupled to the enable inputs of the at least some of the plurality of amplifiers for enabling selectable combinations from among the plurality of amplifiers, whereby particular performance levels and particular levels of power consumption of the input amplifier circuit are selected.

25. The analog-to-digital converter circuit of claim 24, wherein the control logic further comprises control logic for selecting a sample rate of the quantizer, and wherein the control logic sets the enable inputs of the at least some of the plurality of amplifiers in conformity with the selected sample rate.

26. An analog-to-digital converter circuit, comprising:
   a plurality of parallel-connected signal paths for receiving an analog input signal, wherein each of the plurality of parallel-connected signal paths is responsive to a control signal to disable at least one element of the plurality of parallel-connected signal paths, whereby contribution of the at least one element to a total power consumed by the analog-to-digital converter is reduced when the control signal disables the at least one element; and
   a control logic for providing control signals to at least some of the plurality of parallel-connected signal paths to disable the at least one element in the at least some of the plurality of parallel-connected signal paths, whereby the total power consumed by the analog-to-digital converter is reduced in response to an input to the control logic that indicates that full performance of the analog-to-digital converter is not required.

27. The analog-to-digital converter circuit of claim 26, wherein the input to the control logic indicates that a conversion rate of the analog-to-digital converter circuit has been reduced, and wherein the control logic disables at least one of the plurality of parallel-connected signal paths in response to an indication that the conversion rate of the analog-to-digital converter circuit has been reduced.

28. The analog-to-digital converter circuit of claim 26, wherein the at least one element of the plurality of parallel-connected signal paths is an amplifier.

29. The analog-to-digital converter circuit of claim 28, wherein the at least one element of the plurality of parallel-connected signal paths a8 is an amplifier forming a first stage of an analog input path of the analog-to-digital converter circuit.

* * * * *